United States Patent
Ding et al.

(10) Patent No.: US 10,705,648 B2
(45) Date of Patent: Jul. 7, 2020

(54) PIXEL CIRCUIT, ARRAY SUBSTRATE, DISPLAY PANEL, DISPLAY DEVICE AND DISPLAY DRIVING METHOD

(71) Applicant: BOE TECHNOLOGY GROUP CO., LTD., Beijing (CN)

(72) Inventors: Xiaoliang Ding, Beijing (CN); Xue Dong, Beijing (CN); Haisheng Wang, Beijing (CN); Yingming Liu, Beijing (CN); Pengpeng Wang, Beijing (CN); Yanling Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 33 days.

(21) Appl. No.: 15/988,633

(22) Filed: May 24, 2018

(65) Prior Publication Data

US 2019/0114020 A1  Apr. 18, 2019

(30) Foreign Application Priority Data

Oct. 13, 2017 (CN) .......................... 2017 1 0952674

(51) Int. Cl.
```
G06F 3/041    (2006.01)
G06F 3/042    (2006.01)
H01L 27/32    (2006.01)
G09G 3/3225   (2016.01)
H01L 51/52    (2006.01)
```
(52) U.S. Cl.
CPC ............ *G06F 3/0416* (2013.01); *G06F 3/042* (2013.01); *H01L 27/323* (2013.01); *H01L 27/3269* (2013.01); *G09G 3/3225* (2013.01); *G09G 2300/0809* (2013.01); *G09G 2354/00* (2013.01); *G09G 2360/144* (2013.01); *H01L 27/3211* (2013.01); *H01L 51/5253* (2013.01)

(58) Field of Classification Search
None
See application file for complete search history.

(56) References Cited

U.S. PATENT DOCUMENTS

| | | | |
|---|---|---|---|
| 10,175,819 B2 * | 1/2019 | Kwon | ..................... G06F 3/0418 |
| 2008/0073490 A1 * | 3/2008 | Koide | .................... G01J 1/4204 |
| | | | 250/214 C |

(Continued)

FOREIGN PATENT DOCUMENTS

| | | |
|---|---|---|
| CN | 103295525 A | 9/2013 |
| CN | 103456267 A | 12/2013 |

(Continued)

OTHER PUBLICATIONS

Chinese Office Action in Chinese Application No. 201710952674.5, dated Mar. 29, 2019 with English translation.

*Primary Examiner* — Kenneth B Lee, Jr.
(74) *Attorney, Agent, or Firm* — Collard & Roe, P.C.

(57) ABSTRACT

A pixel circuit, an array substrate, a display panel, a display device, and a display driving method are provided. The pixel circuit includes a light emitting element, a pixel driving circuit, and an optical modulation circuit; in a touch stage, turning off the pixel driving circuit, driving the light emitting element to emit a modulated light of a first gray scale by the optical modulation circuit; and in a display stage, turning off the optical modulation circuit, and driving the light emitting element to emit light for display by the pixel driving circuit.

16 Claims, 6 Drawing Sheets

(56) References Cited

U.S. PATENT DOCUMENTS

| | | |
|---|---|---|
| 2015/0103037 A1 | 4/2015 | Wu et al. |
| 2016/0062548 A1 | 3/2016 | Kwon |
| 2016/0246424 A1 | 8/2016 | Yang |
| 2016/0329392 A1 | 11/2016 | Miyake |
| 2019/0157356 A1 | 5/2019 | Li et al. |
| 2019/0163307 A1 | 5/2019 | Cheng et al. |

FOREIGN PATENT DOCUMENTS

| | | |
|---|---|---|
| CN | 103677437 A | 3/2014 |
| CN | 105390093 A | 3/2016 |
| CN | 107016960 A | 8/2017 |
| CN | 107026191 A | 8/2017 |

\* cited by examiner

PIXEL CIRCUIT, ARRAY SUBSTRATE, DISPLAY PANEL, DISPLAY DEVICE AND DISPLAY DRIVING METHOD

CROSS-REFERENCE TO RELATED APPLICATION

The present application claims priority to the Chinese patent application No. 201710952674.5, filed on Oct. 13, 2017, the entire disclosure of which is incorporated herein by reference as part of the present application.

TECHNICAL FIELD

Embodiments of the present disclosure provide a pixel circuit, an array substrate, a display panel, a display device, and a display driving method.

BACKGROUND

Organic light emitting diode (OLED) display panels have become one of the hot topics in the research field of flat panel display panels today, and compared with liquid crystal displays (LCDs), the OLED display panels have the advantages of low energy consumption, low production cost, self-luminescence, wide viewing angle, fast response speed, etc. Currently, OLED display panels have begun to replace traditional LCD display panels in the products in display field such as mobile phones and digital cameras, and are expected to become the mainstream choice for the next generation of display panels.

With the development trend of display panel for becoming thinner, higher-resolution, intelligent, and energy-saving, the use of touch screen panels has become more and more widespread. Currently, because an in-cell touch panel comprises its touch elements inside the display panel, not only can the overall thickness of the module be reduced, but also the production cost of the touch panel can be greatly reduced, and this type of touch panel is favored by major panel manufacturers.

There are three main types of in-cell touch panel: resistive touch panel, capacitive touch panel, and optical touch panel. The implementation of resistance touch panel and capacitive touch panel is very difficult due to the limited process of the OLED, so people turn their attention to the solution of optical touch screen panel. However, optical touch screen panels also have problems. For example, if active modulation light is used to achieve the function of touch, it is better to use the OLED panel's own light emission, but because the light intensity in display produced by the touch screen panel changes over time, the touch amplitudes obtained under different display states of screens are different, so the accuracy of the touch position determination is greatly affected.

SUMMARY

An embodiment of the present disclosure provides a pixel circuit, which comprises a light emitting element, a pixel driving circuit, and an optical modulation circuit; a first terminal and a second terminal of the light emitting element are respectively configured to be connected to a first node and a second level signal terminal; a control terminal, a first terminal and a second terminal of the optical modulation circuit are respectively configured to be connected to a touch sensing signal terminal, a touch scanning signal terminal and the first node, and the optical modulation circuit is configured to drive the light emitting element to emit modulated light in term of a modulation signal provided by the touch scanning signal terminal under control of a touch sensing signal of the touch sensing signal terminal; and a first terminal and a second terminal of the pixel driving circuit are respectively configured to be connected to a first level signal terminal and the first node, and the pixel driving circuit is configured to drive the light emitting element to emit light for display.

In one example of the pixel circuit of an embodiment of the present disclosure, for example, the optical modulation circuit comprises a first switch transistor; as the control terminal, the first terminal and the second terminal of the optical modulation circuit, a gate electrode of the first switch transistor is connected to the touch sensing signal terminal, a first electrode of the first switch transistor is connected to the touch scanning signal terminal, and a second electrode of the first switch transistor is connected to the first node.

In one example of the pixel circuit of an embodiment of the present disclosure, for example, a first level signal output from the first level signal terminal is higher than a second level signal output from the second level signal terminal.

In one example of the pixel circuit of an embodiment of the present disclosure, for example, the light emitting element is an organic light emitting diode.

An embodiment of the present disclosure provides an array substrate, which comprises a plurality of pixel units, and the pixel unit comprises any of the pixel circuits described above.

In one example of the array substrate of an embodiment of the present disclosure, for example, the array substrate further comprises a plurality of optical sensitive sensors, and the optical sensitive sensors are configured to detect the modulated light emitted from the light emitting element of the pixel circuit.

In one example of the array substrate of an embodiment of the present disclosure, for example, the pixel unit is provided in a same layer as the optical sensitive sensors.

In one example of the array substrate of an embodiment of the present disclosure, for example, the array substrate further comprises a plurality of touch signal reading lines, a touch display area of the array substrate is divided into a plurality of sub-areas, and each of the sub-areas comprises at least one of the optical sensitive sensors respectively, and an output terminal of the at least one of the optical sensitive sensors in each of the sub-areas are connected to a same touch signal reading line.

In one example of the array substrate of an embodiment of the present disclosure, for example, input terminals of the optical sensitive sensors are all connected to a same level signal terminal.

In one example of the array substrate of an embodiment of the present disclosure, for example, the array substrate further comprises an ambient light detection sensor, and the ambient light detection sensor is configured to detect ambient light and output a detection result.

In one example of the array substrate of an embodiment of the present disclosure, for example, the array substrate further comprises the touch sensing signal terminal and the touch scanning signal terminal, the touch sensing signal terminal is configured to provide the touch sensing signal, and the touch scanning signal terminal is configured to provide the modulation signal.

An embodiment of the present disclosure provides a display panel comprising an array substrate and a package substrate disposed opposite to each other, and the array substrate is any of the array substrates described above.

An embodiment of the present disclosure provides a display device comprising any of the display panel described above.

In one example of the display device of an embodiment of the present disclosure, for example, the display device further comprises a controller, and the controller is configured to provide the touch sensing signal and the modulation signal.

An embodiment of the present disclosure provides a touch display method of the above display panel, which comprises: in a touch stage, turning off the pixel driving circuit, driving the light emitting element to emit the modulated light of the first gray scale by the optical modulation circuit; and in a display stage, turning off the optical modulation circuit, and driving the light emitting element to emit light for display by the pixel driving circuit.

In one example of the touch display method of an embodiment of the present disclosure, for example, the touch display method further comprises: detecting an intensity of the ambient light, and adjusting the first gray scale of the modulated light emitted by the light emitting element to a second gray scale different from the first gray scale according to a detection result of the intensity of the ambient light.

BRIEF DESCRIPTION OF THE DRAWINGS

In order to clearly illustrate the technical solution of the embodiments of the present disclosure, the embodiments or the drawings of the related technical description will be briefly described in the following, it is obvious that the described drawings are only related to some embodiments of the present disclosure and thus are not limitative of the present disclosure.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
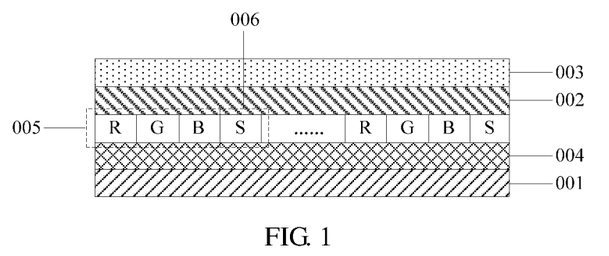
FIG. 1 is a schematic structural diagram of an organic electroluminescent display panel provided by an embodiment of the present disclosure.

An organic electroluminescent display panel is provided by an embodiment of the present disclosure; as shown in FIG. 1, the organic electroluminescent display panel of this embodiment comprises an array substrate 001 and a package substrate 002 disposed opposite to each other, and if necessary, a protective cover 003 disposed on a side of the package substrate 002 facing away from the array substrate 001 may also be provided. For example, the protective cover 003 may be a glass cover; the package substrate 002 may be a thin film encapsulating layer or the like. The protection cover 003 can be combined or attached with the array substrate 001 by a sealant or the like, and the light emitting elements on the array substrate 001 can be further sealed and protected by the package substrate 002. In other embodiments, the package substrate and/or the protective cover 003 may also be replaced with other suitable structures, and the present disclosure is not limited to the structure of a specific panel.

A side of the array substrate 001 facing the package substrate 002 is provided with a pixel circuit 004, a plurality of pixel units 005 and a plurality of optical sensitive sensors 006, and the pixel units and the optical sensitive sensors are disposed on the pixel circuit 004 and disposed in the same layer. The structure in which the pixel units 005 is disposed in the same layer as the optical sensitive sensors 006 can reduce the thickness of the organic electroluminescent display panel and be beneficial to achieve the design of light weight and thin profile, and the pixel units 005 and the optical sensitive sensors 006 can be fabricated directly on the array substrate 001 through the same semiconductor manufacturing processes.

In another embodiment, the pixel units 005 and the optical sensitive sensors 006 may be arranged in different layers, for example, the optical sensitive sensors 006 may be disposed in a lower layer (closer to the array substrate 001) with respect to the array substrate 001, and the pixel units 005 may be disposed in an upper layer, and through holes can be provided in the layer where the pixel units 005 are located to allow light to pass through to arrival the optical sensitive sensors 006.

In one example of this embodiment, as shown in FIG. 1, each of the pixel units 005 comprises a red sub-pixel R, a green sub-pixel G, and a blue sub-pixel B. For example, in another example, in order to increase the brightness of the pixel unit 005, the pixel unit 005 may further comprise a white sub-pixel, and the embodiment of the present disclosure is not specifically limited in this aspect. In another example, the red sub-pixel R, the green sub-pixel G, and the blue sub-pixel B are realized by the combination of a white light emitting element and different color filter layers or quantum dot conversion layers for light of different colors, so these different color sub-pixels may comprise the same or similar pixel circuits and light emitting elements except for the color filter layer or the quantum dot conversion layer.

For example, the optical sensitive sensor 006 can be implemented with any suitable optical sensitive circuit structure to photoelectrically convert the modulated light emitted from the light emitting element to obtain an electrical signal including touch information, for example, the optical sensitive sensor 006 may comprise a photodiode S, or may comprise other optical sensitive sensor known to those skilled in the related art, such as a phototransistor or the like, and the embodiment of the present disclosure is not limited herein. In addition, according to needs, the optical sensitive sensor 006 may also comprise other auxiliary circuits such as an amplifying transistor, a storage capacitor and the like, which will not be described here for simplicity.

The arrangement manner of the pixel units 005 and the optical sensitive sensors 006 may have many ways. For example, one or more optical sensitive sensors 006 may be disposed between any two adjacent pixel units 005. For another example, one or more optical sensitive sensors 006 can also be disposed between any two adjacent groups of pixel units 005 with at least two pixel units 005 as one group. The specific arrangement manner of the pixel units 005 and the optical sensitive sensors 006 can be flexibly disposed according to different application scenarios, and the embodiment of the present disclosure is not specifically limited herein.

Figure 2:
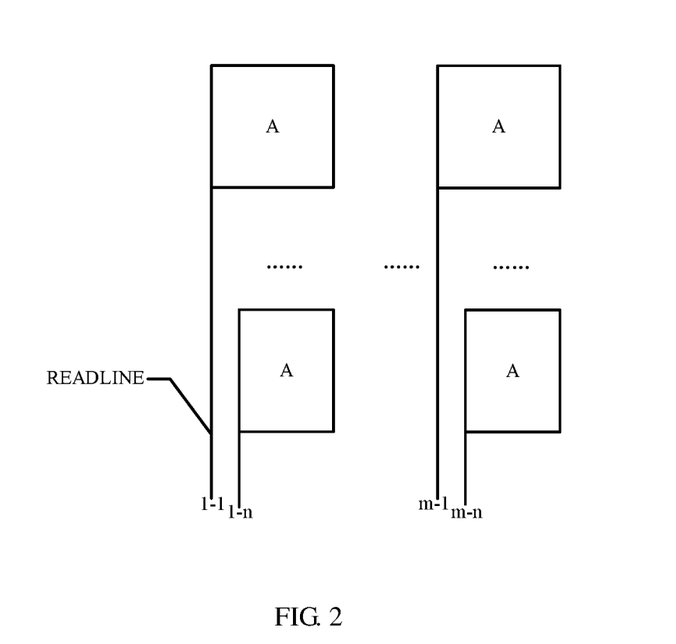
FIG. 2 is a schematic diagram of partitions of an optical sensitive sensor provided by an embodiment of the present disclosure.

The above array substrate 001 provided by the embodiment of the present disclosure, as shown in FIG. 2, may further comprise a plurality of touch signal reading lines READLINE for connecting the optical sensitive sensor 006 and a touch detection chip (not shown in the figure) to allow the touch detection chip to determine the touch position. Each of 1-1, 1-*n*, . . . , m-1, and m-n in FIG. 2 is one serial number of the touch signal reading lines READLINE.

Figure 3:
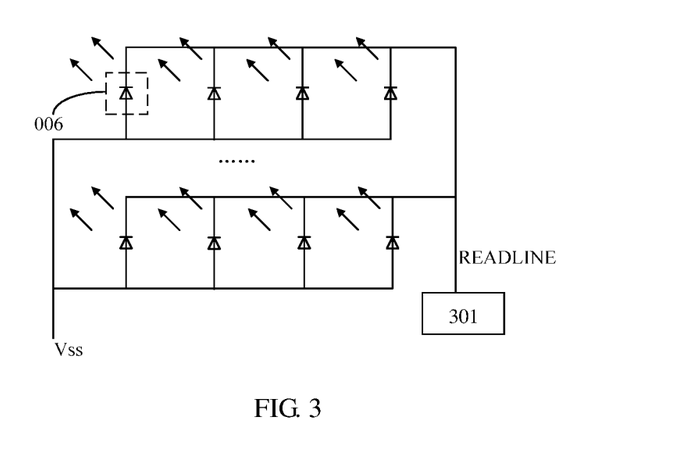
FIG. 3 is an enlarged schematic diagram of one partition as illustrated in FIG. 2.

For example, in order to reduce the wirings of the touch signal reading lines READLINE and save the production cost, as shown in FIG. 2, the touch display area of the array substrate 001 can be divided into a plurality of sub-areas A, and as shown in FIG. 3, each of the sub-areas A comprises at least one of the optical sensitive sensors respectively, and output terminals of the optical sensitive sensors in the same sub-area are connected to a same touch signal reading line READLINE, and the touch signal reading lines is then signally connected to the touch detection chip 301. For example, the touch detection chip 301 is electrically connected to the touch signal reading lines through a bonding area of the display panel.

For example, in one example, in the above array substrate 001 provided in the embodiment of the present disclosure, the input terminals of all optical sensitive sensors are all connected to a low level signal terminal VSS to set the optical sensitive sensor 006 in a bias state by the low level signal terminal VSS. For an example as shown in FIG. 3, the optical sensitive sensors 006 of the same sub-region A may be connected to the low level signal terminal VSS through the same one wire, but the embodiment of the present disclosure does not limit this configuration. For example, the voltage provided by the low level signal terminal VSS is, for example, grounded or less than 0.

Figure 4A:
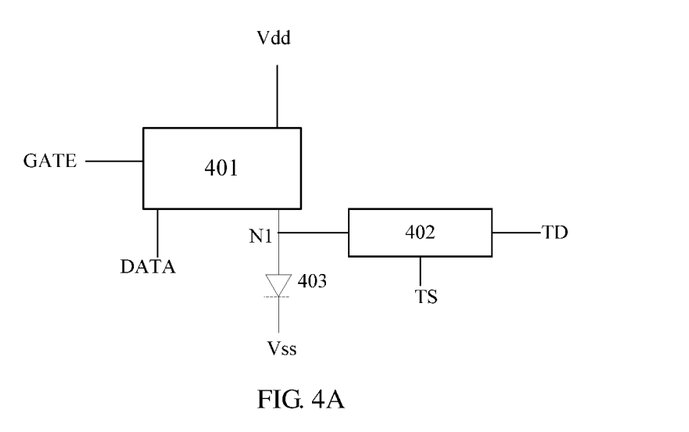
FIG. 4A-4E are schematic structural diagrams of a pixel circuit provided by an embodiment of the present disclosure.

At least one embodiment of the present disclosure provides a pixel circuit. As shown in FIG. 4A, the pixel circuit comprises a light emitting element 403, a pixel driving circuit 401, and an optical modulation circuit 402. The pixel driving circuit 401 comprises a control terminal, a data terminal, a first terminal, and a second terminal, which are respectively connected to a gate line GATE, a data line DATA, a high level signal terminal VDD, and the light emitting element 403, for example, connected to the light emitting element 403 via the first node N1, and the pixel driving circuit 401 is configured to output a driving current to the light emitting element 403 to drive the light emitting element 403 to emit light of a certain brightness for display operation according to a scanning signal, a data signal, and a high level signal provided by the gate line GATE, the data line DATA, and the high level signal terminal VDD, respectively. The voltage provided by the high level signal terminal VDD is higher than the voltage provided by the low level signal terminal VSS.

A first terminal and a second terminal of the light emitting element 403 are respectively connected to the second terminal of the pixel driving circuit 401 and the low level signal terminal VSS, for example, connected to the second terminal of the pixel driving circuit 401 via the first node N1. Therefore, the light emitting element 403 can emit light to perform the display operation under the control of the driving current output from the second terminal of the pixel driving circuit 401 and under the driving of the applied voltage difference between the second terminal of the pixel driving circuit 401 and the low level signal terminal VSS.

The optical modulation circuit 402 comprises a control terminal, an input terminal, and an output terminal, which are respectively connected to a touch sensing signal terminal TS, a touch scanning signal terminal TD, and the first terminal of the light emitting element 403, for example, connected to the first terminal of the light emitting element 403 via the first node N1, so that the light emitting element 403 can be driven to emit modulated light of a preset gray scale for a touch operation according to a touch sensing signal and a touch scanning signal (modulation signal) provided by the touch sensing signal terminal TS and the touch scanning signal terminal TD, respectively.

In a touch stage, the pixel driving circuit 401 is turned off, and under the control of the touch sensing signal terminal TS, the optical modulation circuit 402 drives the light emitting element 403 to emit modulated light of a preset gray scale in term of the modulation signal of the preset frequency output from the touch scanning signal terminal TD; in a display stage, the optical modulation circuit 402 is turned off, and the pixel drive circuit 401 drives the light emitting element 403 to emit light for display.

At least one embodiment of the present disclosure provides another pixel circuit. A schematic diagram of the pixel circuit is shown in FIG. 4B, and the pixel circuit also comprises a light emitting element 403, a pixel driving circuit 401', and an optical modulation circuit 402, but the pixel driving circuit 401' is different from the pixel driving circuit 401 of the foregoing embodiment as shown in FIG. 4A, so the connection of these components also changes accordingly.

Figure 4B:
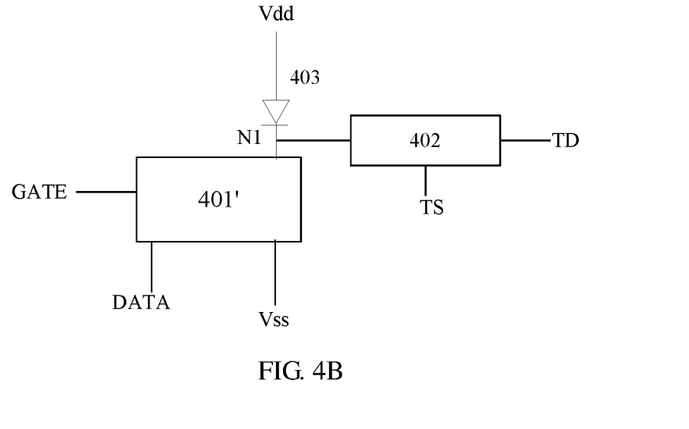

As shown in FIG. 4B, the pixel driving circuit 401' comprises a control terminal, a data terminal, a first terminal, and a second terminal, which are respectively connected to the gate line GATE, the data line DATA, the low level signal terminal VSS, and the light emitting element 403, for example, connected to the light emitting element 403 via the first node N1, and the pixel driving circuit 401' is configured to output the driving current to the light emitting element 403 to drive the light emitting element 403 to emit light of a certain brightness according to the scanning signal, the data signal, and the low level signal provided by the gate line GATE, the data line DATA, and the low level signal terminal $V_{SS}$, respectively.

The first terminal and the second terminal of the light emitting element 403 are connected to the second terminal of the pixel driving circuit 401' and the high level signal terminal Vdd, respectively, for example, connected to the second terminal of the pixel driving circuit 401' via the first node N1. Therefore, the light emitting element 403 can emit light under the control of the driving current outputted from the second terminal of the pixel driving circuit 401' and under the driving of the applied voltage difference between the second terminal of the pixel driving circuit 401' and the high level signal terminal Vdd.

The optical modulation circuit 402 comprises the control terminal, the input terminal, and the output terminal, which are respectively connected to the touch sensing signal terminal TS, the touch scanning signal terminal TD, and the first terminal of the light emitting element 403, for example, connected to the first terminal of the light emitting element 403 via the first node N1, so the light emitting element 403 can be driven to emit modulated light of the preset gray scale according to the touch sensing signal and the touch scanning signal provided by the touch sensing signal terminal TS and the touch scanning signal terminal TD, respectively.

Similarly, in a touch stage, the pixel driving circuit 401' is turned off, and under the control of the touch sensing signal terminal TS, the optical modulation circuit 402 drives the light emitting element 403 to emit modulated light of the preset gray scale in term of the modulation signal of the preset frequency output from the touch scanning signal terminal TD; in a display stage, the optical modulation circuit 402 is turned off, and the pixel drive circuit 401 drives the light emitting element 403 to emit light for display.

In the above embodiments, the light emitting element 403 is an organic light emitting diode (OLED), and the embodiments of the present disclosure do not limit the specific structure, material, preparation process and the like of the OLED. For example, the OLED may be a top emission type, a bottom emission type, and the like, and the OLED can use high molecular organic light emitting materials, small molecule organic light emitting materials, and the like.

Figure 4C:
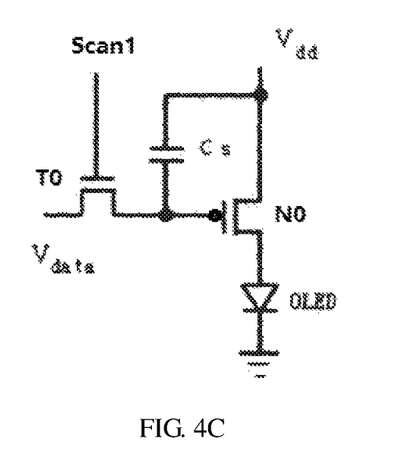
Figure 4D:
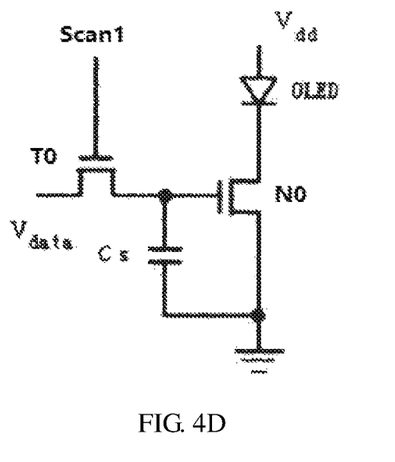

The pixel circuit used in the AMOLED display panel can be, for example, a pixel circuit of 2T1C, that is, two TFTs (Thin Film Transistors) and one storage capacitor Cs is used to achieve the basic function of driving the OLED to emit light. FIGS. 4C and 4D are schematic diagrams respectively illustrating two kinds of pixel circuits of 2T1C, corresponding to the pixel driving circuit 401 and the pixel driving circuit 401' in FIGS. 4A and 4B, respectively, and the OLED as a light emitting element is also shown in the drawing for the sake of clarity.

The pixel circuit of 2T1C as shown in FIG. 4C comprises a switching transistor T0, a driving transistor N0, and a storage capacitor Cs. For example, a gate electrode of the switching transistor T0 is connected to a gate line (scanning line) to receive a scan signal (Scant), for example, a source electrode of the switching transistor T0 is connected to a data line to receive a data signal (Vdata), and a drain electrode of the switching transistor T0 is connected to a gate electrode of the driving transistor N0; a source electrode of the driving transistor N0 is connected to the high level signal terminal Vdd, and a drain electrode of the driving transistor N0 is connected to an anode of the OLED; one terminal of the storage capacitor Cs is connected to the drain electrode of the switching transistor T0 and the gate electrode of the driving transistor N0, the other terminal of the storage capacitor Cs is connected to the source electrode of the driving transistor N0 and the high level signal terminal Vdd; and a cathode of the OLED is connected to the low level signal terminal Vss, for example, grounded. The pixel circuit of 2T1C is driven by controlling the brightness and darkness (gray scale) of a sub-pixel via the two TFTs and the storage capacitor Cs. When the scan signal Scant is applied through the gate line to turn on the switching transistor T0, the data voltage (Vdata) transmitted from the data driving circuit through the data line will charge the storage capacitor Cs via the switching transistor T0, thereby storing the data voltage in the storage capacitor Cs, and the stored data voltage controls the conduction (turn-on) degree of the driving transistor N0, thereby controlling the current flowing through the driving transistor to drive the OLED to emit light, that is, the current determines the gray level of light emitted by the sub-pixel. In the pixel circuit of 2T1C as shown in FIG. 4C, the switching transistor T0 is an N-type transistor and the driving transistor is a P-type transistor.

The other pixel circuit of 2T1C as shown in FIG. 4D also comprises the switching transistor T0, the driving transistor N0, and the storage capacitor Cs, but the connection mode thereof is changed, and the driving transistor N0 is an N-type transistor. The anode of the OLED is connected to the high level signal terminal Vdd and the cathode is connected to the drain electrode of the driving transistor N0, and the source electrode of the driving transistor N0 is connected to the low level signal terminal Vss, for example, ground. One terminal of the storage capacitor Cs is connected to the drain electrode of the switching transistor T0 and the gate electrode of the driving transistor N0, and the other terminal is connected to the source electrode of the driving transistor N0 and the low level signal terminal. The operation mode of the pixel circuit of 2T1C is basically the same as the pixel circuit shown in FIG. 4C, and that will not be described here again.

In addition, for the pixel circuit shown in FIG. 4C and FIG. 4D, the switching transistor T0 is not limited to an N-type transistor, and may also be a P-type transistor, so the polarity of the scan signal (Scan1) that controls the on/off state of the transistor can be changed accordingly.

The AMOLED display panel usually comprises a plurality of pixel units arranged in an array, and each pixel unit may use one kind of the above-mentioned pixel circuits, for example. However, there occurs an resistance voltage drop (IR drop) phenomenon over the power wires connecting the high level signal terminal Vdd or the low level signal terminal Vss in the display panel, and the resistance voltage drop is caused by the self-resistance voltage division of the wires in the display panel, that is, when the current passes through the wires in the display panel, some certain voltage drops occur over the wires according to the Ohm's law. Therefore, the pixel units located at different positions are affected to different extents by the resistance voltage drops, which may cause the display panel to display unevenly. Therefore, it is necessary to compensate for the voltage drops in the OLED display panel. Moreover, in an OLED display panel, the threshold voltage of the driving transistor in each of pixel units may vary due to the manufacturing process or over time, and the threshold voltage of the driving transistor may also drift due to, for example, the influence of a temperature change. Therefore, the difference in the threshold voltages of the driving transistors may also cause the display panel to display unevenly. Therefore, the above reasons also lead to the need to compensate for the threshold voltage.

Therefore, the industry also provides a various kinds of pixel circuits having a compensation function based on the above-mentioned basic pixel circuit of 2T1C, and the compensation function can be implemented by voltage compensation, current compensation, or hybrid compensation, and the pixel circuit with a compensation function can be, for example, in the configuration of 4T1C, 4T2C and so on.

Figure 4E:
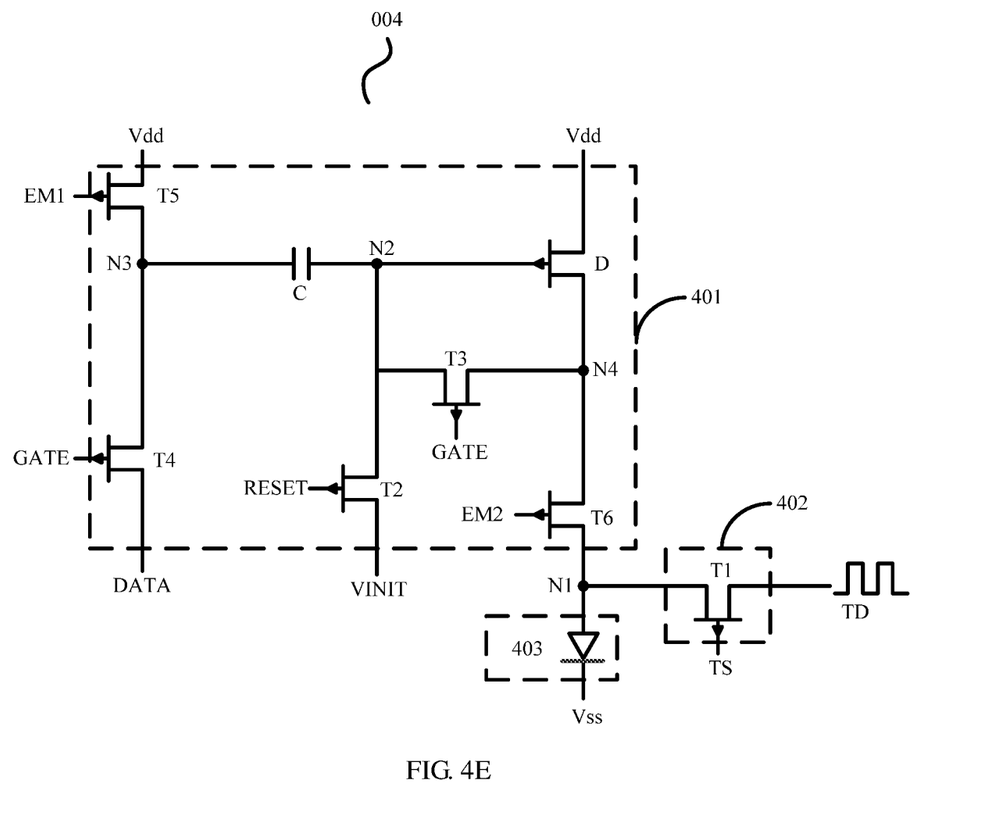

Another embodiment of the present disclosure, as shown in FIG. 4E, provides a pixel circuit 004 possessing a compensation function. As shown in FIG. 4E, the pixel circuit 004 comprises the light emitting element 403, the pixel driving circuit 401, and the optical modulation circuit 402.

The control terminal of the optical modulation circuit 402 is connected to the touch sensing signal terminal TS, the input terminal is connected to the touch scanning signal terminal TD, and the output terminal is connected to the first node N1; the output terminal of the pixel driving circuit 401 is connected to the first node N1, and one terminal of the light emitting element 403 is connected to the first node N1, and the other terminal is connected to the low level signal terminal ELVSS.

In the touch stage, the pixel driving circuit 401 is turned off, and under the control of the touch sensing signal terminal TS, the optical modulation circuit 402 drives the light emitting element 403 to emit modulated light of the preset gray scale in term of the modulation signal of the preset frequency output from the touch scanning signal terminal TD; in the display stage, the optical modulation circuit 402 is turned off, and the pixel drive circuit 401 drives the light emitting element 403 to emit light for display.

The pixel circuit of the above embodiment may be applied only for a sub-pixel of a certain color in a pixel unit, for example, a red sub-pixel R, a green sub-pixel G, or a blue sub-pixel B, and the modulated light used for touch detection is monochromatic light in this example; the pixel circuits of the above embodiments may also be applied for sub-pixels of all colors in a pixel unit, and in this example, the modulated light for touch detection is white light. In the embodiment of the present disclosure, all or part of the display area of the display panel is used for touch operation, and the display area that can be used for touch operation is the touch display area (similarly, the array substrate of the display panel has the touch display area), and the optical sensitive sensors 006 are disposed in the touch display area. If the resolution (sensitivity) of the normal touch operation is lower than the resolution of the display operation, one optical sensitive sensor may be correspondingly provided for a plurality of pixel units in the touch display area.

In the pixel circuit provided in the embodiment of the present disclosure, because in the touch stage, the optical modulation circuit 402 provides the modulation signal of the preset frequency output from the touch scanning signal terminal TD to the light emitting element 403 under the control of the touch sensing signal terminal TS, the light emitting element 403 emits modulated light of the preset gray scale, thereby ensuring the stability of the light emission luminance of light emitting element 403 in the touch stage. In this way, the problem that the optical touch detection is inaccurate due to the change of the light emission luminance of the light emitting element 403 over time is effectively avoided.

In the pixel circuit provided in the embodiment of the present disclosure, in the touch stage, the light emitting element 403 emits modulated light of the preset gray scale, and the optical sensitive sensor 006, such as the photodiode S, can receive ambient light and the modulated light reflected by the finger, and the optical sensitive sensor 006 is connected to the touch detection chip 301 through the touch signal reading line READLINE, so the touch detection chip can be used to demodulate and detect the light signal received by the optical sensitive sensor 006, and only the modulated light reflected by the finger at the touch position can be demodulated to generate the signal corresponding to the touch of finger, and in this way accurate detection of the touch position can be achieved. Through proper settings, the touch detection chip can only demodulate the modulated light, thereby avoiding the interference of the ambient light on the touch detection, and further improving the accuracy of the touch detection.

For example, in the above pixel circuit 004 provided in the embodiment of the present disclosure, in order to enable the light emitting element 403 to emit modulated light with different gray levels according to the modulation signal of the preset frequency output by the touch scanning signal terminal TD, the low level of the modulation signal of the preset frequency output from the touch scanning signal terminal TD may be controlled to be lower than the low level output from the low level signal terminal so as to make the light emitting element 403 not to emit light and therefore display in a dark state of the gray scale of 0. Moreover, the light emitting element 403 emits the modulated light of other gray scales, that is, displays the bright state of other gray scales other than the gray scale of 0, by controlling the high level of the modulation signal of the preset frequency output from the touch scanning signal terminal TD. For example, the amplitude relative to the reference voltage of the high level of the modulation signal of the preset frequency output from the touch scanning signal terminal TD is set proportional to the intensity of the ambient light.

For example, in the above pixel circuit provided in the embodiment of the present disclosure, the high level of the modulation signal can be controlled according to the intensity of the ambient light. On one hand, if the intensity of the ambient light is strong, the high level of the modulation signal of a larger amplitude is selected to increase the gray scale (brightness) of the modulated light, in this way, the problem that the modulated light signal is too small to be detected due to the strong ambient light can be avoided; at the same time, due to the strong ambient light, insertion of light a higher brightness gray scale in a short time period (<1 ms) during display will not be felt by a human user. On the other hand, if the ambient light is weak, the high level of the modulation signal with a smaller amplitude is selected to appropriately reduce the gray scale (brightness) of the modulated light, so that the picture anomalies caused by inserting light of the higher brightness gray scale can be avoided.

In addition, for the pixel circuit 004 provided by the embodiment of the present disclosure, the intensity of the ambient light can be detected in various ways. For example, in one example, in order to simplify the circuit structure of the display panel, the intensity of the ambient light may be detected by the above-mentioned optical sensitive sensors 006 for detecting the touch operation, and the value of the high level of the modulation signal of the preset frequency output by the touch scanning signal terminal TD is set according to the intensity of the detected ambient light. Further, when the intensity of the light signals detected by each of the optical sensitive sensors 006 is nearly equal, it is illustrated that there is no touch action at this time, and the intensity of light detected by each of the optical sensitive sensors 006 corresponds to that of the ambient light.

In another example, an optical sensitive sensor for detecting the ambient light may be separately provided to detect the intensity of the ambient light, and the optical sensitive sensor may return the detected signal relating to the detected intensity of the ambient light to a system controller (not shown) to set the level of the modulation signal of the preset frequency output by the touch scanning signal terminal TD.

Specific embodiments of the present disclosure will be described in detail below with reference to the specific embodiment shown in FIG. 4E. It should be noted that this embodiment is for better explanation of the disclosure but does not limit the disclosure.

In the pixel circuit provided in the embodiment of the present disclosure, the optical modulation circuit 402 comprises a first switch transistor T1; a gate electrode of the first switch transistor T1 is connected to the touch sensing signal terminal TS, and a source electrode is connected to the touch scanning signal terminal TD, and a drain electrode is connected to the first node N1.

In the above pixel circuit 004 provided in the embodiment of the present disclosure, when the first switch transistor T1 is in a conductive state under the control of the touch sensing signal terminal TS, the touch scan signal terminal TD outputs the modulation signal of the preset frequency to the first node N1 to drive the light emitting element 403 to emit the modulated light of the preset gray scale.

The above is merely an example to illustrate the specific structure of the optical modulation circuit 402 in the pixel circuit 004. In practice, the specific structure of the optical modulation circuit 402 is not limited to the above mentioned structure provided by the embodiments of the present disclosure, and it may also be other structures as known by those skilled in the art, which are not limited herein.

As described above, in the pixel circuit 004 provided by the embodiment of the present disclosure, the pixel driving circuit 401 may use any suitable pixel driving circuit that can be used to drive the light emitting element 403 to perform display light emission, for example, the pixel driving circuit of 2T1C, and the pixel driving circuit of 6T1C as shown in FIG. 4E, that is, it can be selected according to actual needs, and the embodiment of the present disclosure is not specifically limited herein.

As described above, the source electrode and the drain electrode of the first switching transistor T1 and the transistors in the pixel driving circuit 401 mentioned in the above embodiments of the present disclosure can be interchanged in function according to different types of the transistor and different input signals, and no specific distinction is required herein. Generally, when a transistor is a P-type transistor, the source electrode of the transistor is an input terminal and the drain electrode of the transistor is an output terminal; when the transistor is an N-type transistor, the drain electrode of the transistor is an input terminal and the source electrode of the transistor is an output terminal. The transistors mentioned in the embodiments of the present disclosure may all be P-type transistors or N-type transistors, which are not limited herein.

Figure 5:
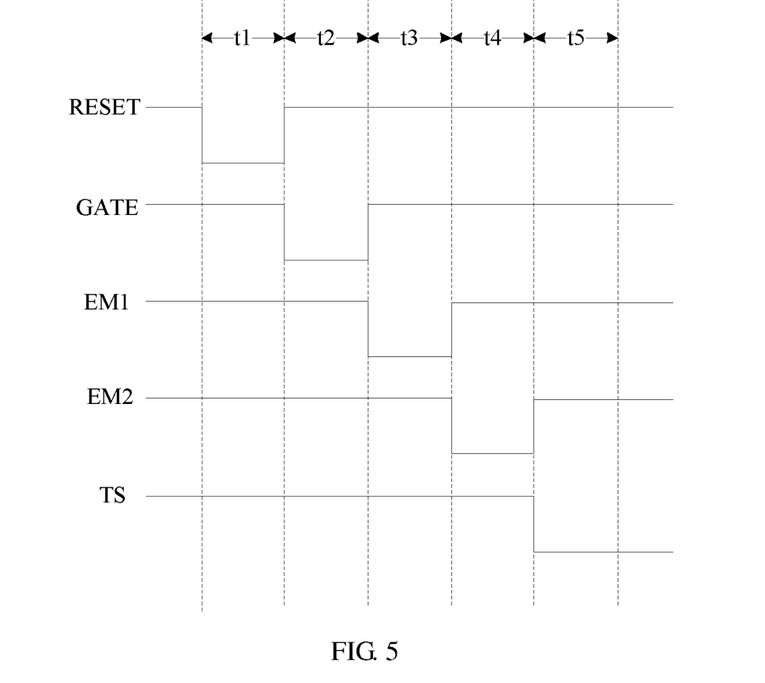
FIG. 5 is an operation timing diagram of the pixel circuit as shown in FIG. 4E.

The working process of the pixel circuit 004 as shown in FIG. 4E will be described as an example in the following. In the pixel circuit 004 as shown in FIG. 4E, each of the transistors is a P-type transistor, and each of the P-type transistors is turned on under the control of a low level (turn-on level) and turned off under the control of the high level (turn-off level); and the corresponding operation timing diagram is shown in FIG. 5. Specifically, a reset stage t1, a charging stage t2, a compensation stage t3, a light emitting stage t4, and the touch stage t5 in the operation timing diagram as shown in FIG. 5 are selected as an example for detailed description. The reset stage t1, the charging stage t2, the compensation stage t3 and the light emission stage t4 together form a display stage.

(1) Reset Stage t1

A reset signal terminal RESET is at a low level, a gate scanning signal terminal GATE is at a high level, a first light emitting control terminal EM1 is at a high level, a second light emitting control terminal EM2 is at a high level, and a touch sensing signal terminal TS is at a high level.

A second switch transistor T2 is in the turn-on state, and the first switch transistor T1, a third switch transistor T3, a fourth switch transistor T4, a fifth switch transistor T5, a sixth switch transistor T6, and a drive transistor D are in the turn-off state. A gate electrode of the driving transistor D (that is, a second node N2) and a reset signal terminal VINIT are electrically connected by the turned-on second switching transistor T2, so the voltage of the gate electrode of the driving transistor D can be initialized, and the voltage across the capacitor C is reset, and the influence of the previously provided voltage difference on the following stages can be eliminated.

(2) Charging Stage t2

The reset signal terminal RESET is at a high level, the gate scanning signal terminal GATE is at a low level, the first light emitting control terminal EM1 is at a high level, the second light emitting control terminal EM2 is at a high level, and the touch sensing signal terminal TS is at a high level.

The third switching transistor T3, the fourth switching transistor T4, and the driving transistor D are in the turn-on state, and the first switching transistor T1, the second switching transistor T2, the fifth switching transistor T5, and the sixth switching transistor T6 are in the turn-off state. The data signal terminal DATA and the third node N3, namely, the left terminal of the capacitor C, are electrically connected by the turned-on fourth switching transistor T4, and further the signal Vdata output by the data signal terminal DATA is transmitted to the left terminal of the capacitor C, and the voltage of the left terminal of the capacitor C is Vdata, and the right terminal of the capacitor C (that is, the second node N2) also becomes Vdata due to the effect of charging the capacitor C at this time, and the driving transistor D is in the turn-on state, and the signal $V_{dd}$ of the first reference signal terminal ELVDD is output to the right terminal of the capacitor C through the driving transistor D and the third switching transistor T3 which are turned-on at this time, and finally the voltage of the second node N2 becomes $V_{dd}-V_{th}$, and the voltage difference across the capacitor C is $V_{data}-V_{dd}+V_{th}$, where $V_{th}$ is the threshold voltage of the driving transistor D.

Compensation Stage t3

The reset signal terminal RESET is at a high level, the gate scanning signal terminal GATE is at a high level, the first light emitting control terminal EM1 is at a low level, the second light emitting control terminal EM2 is at a high level, and the touch sensing signal terminal TS is at a high level.

The fifth switch transistor T5 is in the turn-on state, and the first switch transistor T1, the second switch transistor T2, the third switch transistor T3, the fourth switch transistor T4, the sixth switch transistor T6, and the driving transistor D are all in the turn-off state. The first reference signal ELVDD and the third node N3 are electrically connected by the turned-on fifth transistor T5, so the voltage signal Vdd output from the first reference signal ELVDD is transmitted to the third node N3, and the voltage signal of the third node N3, that is, the left terminal of the capacitor C, becomes Vdd; because the voltage difference across the capacitor C is $V_{data}-V_{dd}+V_{th}$ in the charging stage, the voltage of the right terminal of the capacitor C is $2V_{dd}-V_{data}-V_{th}$.

Light Emission Stage t4

The reset signal terminal RESET is at a high level, the gate scanning signal terminal GATE is at a high level, the first light emitting control terminal EM1 is at a high level, the second light emitting control terminal EM2 is at a low level, and the touch sensing signal terminal TS is at a high level.

The sixth switching transistor T6 and the driving transistor D are in the turn-on state, and the first switching transistor T1, the second switching transistor T2, the third switching transistor T3, the fourth switching transistor T4, and the fifth switching transistor T5 are in the turn-off state. The fourth node N4 (i.e., the drain electrode of the driving transistor D) and the anode of the light emitting element 403 are electrically connected by the turned-on sixth switching transistor T6, and the cathode of the light emitting element 403 is applied with the signal $V_{ss}$ of the second reference voltage signal terminal ELVSS at this time, and the driving transistor D is turned on under the control of the second node N2, and the light emitting element 403 is driven to normally emit light to perform display through the turned-on the sixth switching transistor T6, and the operating current $I_{OLED}$ of the light emitting element 403 is:

$$I_{OLED}=\tfrac{1}{2}K(V_{GS}-V_{th})^2=\tfrac{1}{2}K[V_{dd}-(2V_{dd}-V_{data}-V_{th})-V_{th}]^2=\tfrac{1}{2}K(V_{data}-V_{dd})^2$$

where K is a constant related to the process parameters and the geometric dimensions of the driving transistor D, and $V_{GS}$ is the voltage difference between the gate electrode and the source electrode of the driving transistor D. According to the above analysis, it can be known that the current for driving the light emitting element 403 to emit light is independent of the threshold voltage $V_{th}$ of the driving transistor D, so the influence of the change or fluctuation of the threshold voltage of the driving transistor D on the light emitting luminance of the light emitting element 403 is eliminated, the uniformity of the light emitting luminance of the display panel is improved, and the display quality is enhanced.

(5) Touch Stage t5

The reset signal terminal RESET is at a high level, the gate scanning signal terminal GATE is at a high level, the first light emitting control terminal EM1 is at a high level, the second light emitting control terminal EM2 is at a high level, and the touch sensing signal terminal TS is at a low level.

The first switch transistor T1 is in the turn-on state, and the second switch transistor T2, the third switch transistor T3, the fourth switch transistor T4, the fifth switch transistor T5, the sixth switch transistor T6, and the driving transistor D are in the turn-off state. The modulation signal of the preset frequency output from the touch scanning signal terminal TD is provided to the first node N1 through the turned-on first switching transistor T1, so the first node N1 can be used to control the light emitting element 403 to emit the modulated light of the preset gray scale; in this way, the problem of the instability of the light source is overcome by inserting a image of a fixed gray scale, thereby improving the accuracy of touch detection.

In the following, the pixel circuit will repeat the working process of the above mentioned stages t1-t5 to realize the display function and the touch function.

An embodiment of the present disclosure further provides a display device, which comprises the above mentioned organic electroluminescent display panel provided by any of the embodiments of the present disclosure, and the display device can be implemented as any product or component having a display function such as a mobile phone, a tablet computer, a television, a monitor, a notebook computer, a digital photo frame, a navigator, a smart watch, a fitness wristband, a personal digital assistant, or the like.

Figure 6:
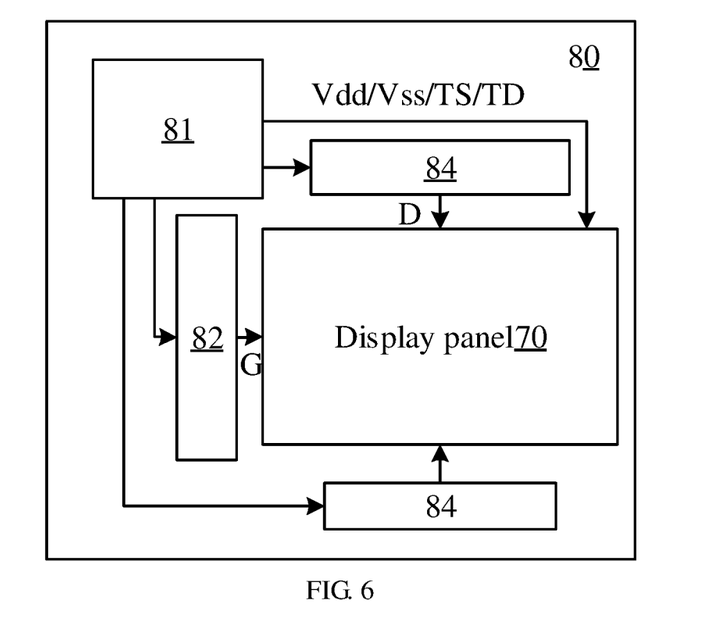
FIG. 6 is a schematic diagram of a display device provided by an embodiment of the present disclosure.

FIG. 6 is a schematic block diagram of the display device provided by an embodiment of the present disclosure. As shown in FIG. 6, the display device 80 comprises the organic electroluminescent display panel 70 according to any of the embodiments of the above disclosure.

For example, the display device 80 may further comprise a controller 81, a gate driving circuit 82, a data driving circuit 83, a touch driving circuit 84, and the like.

The gate driving circuit 81 is configured to be electrically connected to the pixel circuit in the pixel unit through a gate line in the display panel 70 to provide the scanning signal G The gate driving circuit 81 may be implemented as a gate driving chip, for example, and then electrically connected to the gate line through the bonding area of the display panel 70, or may be implemented as a gate-driver on array (GOA) on the array substrate, that is, this gate-driver is directly formed on the array substrate of the display panel, which is more conducive to achieve the design of narrow bezel and for improving the integration degree of products.

The data driving circuit 83 is electrically connected to the pixel circuit in the pixel unit through the data line for providing the data signal D to the display panel 70, and the data driving circuit 83 may be implemented as a data driving chip, for example, and is electrically connected to the data line through the bonding area of the display panel 70.

The touch driving circuit 84 is electrically connected to the optical sensitive sensor for touch detection through the touch signal reading line, and the touch driving circuit 84 can be implemented as a touch detection chip, for example, and is connected to the touch signal reading line through the bonding area of the display panel 70.

The controller 81 is connected to the gate driving circuit 82, the data driving circuit 83, the touch driving circuit 84 and the display panel 70, and can provide the timing control signal(s) to the gate driving circuit 82, the data driving circuit 83 and the touch driving circuit 84, and can provide the high level signal Vdd, the low level signal Vss, the touch sensing signal TS, the touch scanning signal TD and the like to the display panel 70 to control and coordinate their operations. For example, the controller 81 may be implemented as a timing controller (T-con) or any other circuit structure with control and the processing functions. For example, at least partition of the controller 81 may be implemented through software, hardware, firmware, or the like. In one example of this embodiment, the controller 81 and the gate driving circuit 82, the data driving circuit 83, and the touch driving circuit 84 may be integrated in a single chip.

Other essential components of the display device are understood by those of ordinary skill in the art, are not described herein, and should not be taken as limiting the present disclosure. For the implementation of the display device can refer to the above embodiments of the organic electroluminescent display panel, and the repeated description is omitted.

Figure 7:
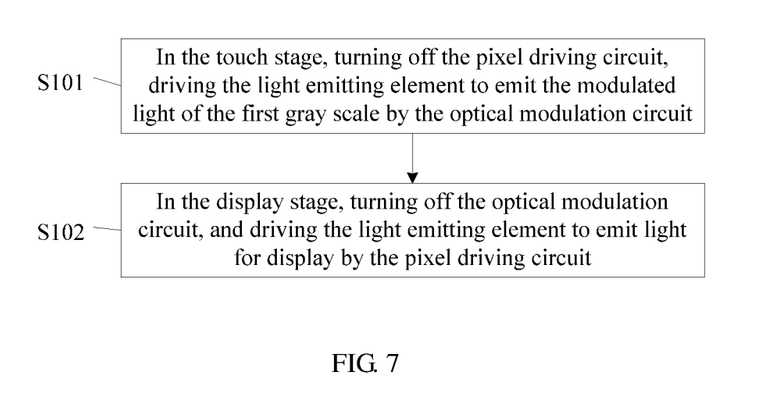
FIG. 7 is a flowchart of a touch display method provided by an embodiment of the present disclosure.

An embodiment of the present disclosure further provides a touch display method corresponding to the above display panel. As shown in FIG. 7, the touch display method comprises the following operations S101-S102:

Step S101: In the touch stage, turning off the pixel driving circuit, driving the light emitting element to emit the modulated light of a first gray scale by the optical modulation circuit.

Step S102: In the display stage, turning off the optical modulation circuit, and driving the light emitting element to emit light for display by the pixel driving circuit.

The touch display method according to the embodiment of the present disclosure does not limit the order and the frequency of the touch stage and the display stage. For example, the touch frequency and the display frequency may be the same, that is, one touch operation may be performed with or during one frame of display operation, and the display operation may be performed first, and then the touch operation may be performed.

In an example of an embodiment of the present disclosure, the touch display method further comprises detecting the intensity of the ambient light, and adjusting the gray scale of the modulated light of the light emitting element according to the detection result of the intensity of the ambient light. For example, if the intensity of the ambient light is strong, the gray scale (brightness) of the modulated light is increased, and the gray scale is adjusted from a lower gray scale to a higher gray scale so as to avoid the situation that the modulated light signal is too small to be detected due to the strong ambient light; if the ambient light is weak, the gray scale (brightness) of the modulated light is appropriately reduced, and the gray scale is adjusted from a higher gray scale to a lower gray scale so as to avoid the display abnormality caused by inserting the higher brightness gray scale.

As for the pixel circuit, the array substrate, the organic electroluminescent display panel and the display device provided by the embodiments of the present disclosure, because the optical modulation circuit provides the modulation signal of the preset frequency output from the touch scanning signal terminal to the light emitting element under the control of the touch sensing signal terminal in the touch stage, the light emitting element emits the modulated light of a preset gray scale, thereby ensuring the stability of the light emitting luminance of the light emitting element in the touch stage, and the problem of the inaccurate optical touch detection caused by the change or fluctuation of the light emission luminance of the light emitting element over time is effectively solved.

What are described above is related to the illustrative embodiments of the disclosure only and not limitative to the scope of the disclosure, the scopes of the disclosure are defined by the accompanying claims.

What is claimed is:

1. A pixel circuit, comprising a light emitting element, a pixel driving circuit, and an optical modulation circuit,
   wherein a first terminal and a second terminal of the light emitting element are respectively configured to be connected to a first node and a second level signal terminal;
   a control terminal, a first terminal and a second terminal of the optical modulation circuit are respectively configured to be connected to a touch sensing signal terminal, a touch scanning signal terminal and the first node, and the optical modulation circuit is configured to drive the light emitting element to emit modulated light in term of a modulation signal provided by the touch scanning signal terminal under control of a touch sensing signal of the touch sensing signal terminal; and
   a first terminal and a second terminal of the pixel driving circuit are respectively configured to be connected to a first level signal terminal and the first node, and the pixel driving circuit is configured to drive the light emitting element to emit light for display.

2. The pixel circuit according to claim 1, wherein the optical modulation circuit comprises a first switch transistor;
   as the control terminal, the first terminal and the second terminal of the optical modulation circuit, a gate electrode of the first switch transistor is connected to the touch sensing signal terminal, a first electrode of the first switch transistor is connected to the touch scanning signal terminal, and a second electrode of the first switch transistor is connected to the first node.

3. The pixel circuit according to claim 1, wherein a first level signal output from the first level signal terminal is higher than a second level signal output from the second level signal terminal.

4. The pixel circuit according to claim 1, wherein the light emitting element is an organic light emitting diode.

5. An array substrate, comprising a plurality of pixel units, wherein the pixel units each comprise the pixel circuit according to claim 1.

6. The array substrate according to claim 5, further comprising a plurality of optical sensitive sensors,
   wherein the optical sensitive sensors are configured to detect the modulated light emitted from the light emitting element of the pixel circuit.

7. The array substrate according to claim 6, wherein the pixel unit is provided in a same layer as the optical sensitive sensors.

8. The array substrate according to claim 6, further comprising a plurality of touch signal reading lines,
   wherein a touch display area of the array substrate is divided into a plurality of sub-areas, and each of the sub-areas comprises at least one of the optical sensitive sensors respectively, and an output terminal of the at least one of the optical sensitive sensors in each of the sub-areas is connected to a same touch signal reading line.

9. The array substrate according to claim 6, wherein input terminals of the optical sensitive sensors are all connected to a same level signal terminal.

10. The array substrate according to claim 6, further comprising an ambient light detection sensor,
    wherein the ambient light detection sensor is configured to detect ambient light and output a detection result.

11. The array substrate according to claim 5, further comprising the touch sensing signal terminal and the touch scanning signal terminal,
    wherein the touch sensing signal terminal is configured to provide the touch sensing signal, and the touch scanning signal terminal is configured to provide the modulation signal.

12. A display panel comprising an array substrate and a package substrate disposed opposite to each other,
    wherein the array substrate is the array substrate according to claim 5.

13. A display device comprising the display panel according to claim 12.

14. The display device according to claim 13, further comprising a controller, wherein the controller is configured to provide the touch sensing signal and the modulation signal.

15. A touch display method of the display panel according to claim 12, comprising:

in a touch stage, turning off the pixel driving circuit, driving the light emitting element to emit the modulated light of a first gray scale by the optical modulation circuit; and in a display stage, turning off the optical modulation circuit, and driving the light emitting element to emit light for display by the pixel driving circuit.

16. The touch display method according to claim 15, further comprising:

detecting an intensity of the ambient light, and adjusting the first gray scale of the modulated light emitted by the light emitting element to a second gray scale different from the first gray scale according to a detection result of the intensity of the ambient light.

* * * * *